United States Patent
Devanagondi et al.

(10) Patent No.: US 7,529,908 B2
(45) Date of Patent: May 5, 2009

(54) METHOD AND APPARATUS FOR UNIFIED EXCEPTION HANDLING WITH DISTRIBUTED EXCEPTION IDENTIFICATION

(75) Inventors: Harish R. Devanagondi, Saratoga, CA (US); Rajesh Patil, Santa Clara, CA (US); Sanjeev Mahalawat, Cupertino, CA (US); Jianyong Sun, Fremont, CA (US)

(73) Assignee: Cisco Technology, INc., San Jose, CA (US)

( * ) Notice: Subject to any disclaimer, the term of this patent is extended or adjusted under 35 U.S.C. 154(b) by 7 days.

(21) Appl. No.: 11/431,444

(22) Filed: May 9, 2006

(65) Prior Publication Data

US 2006/0206620 A1    Sep. 14, 2006

(51) Int. Cl.
   *G06F 7/499* (2006.01)
(52) U.S. Cl. .......................................... 712/36; 711/169
(58) Field of Classification Search ................. 712/244; 711/169
   See application file for complete search history.

(56) References Cited

U.S. PATENT DOCUMENTS

| | | |
|---|---|---|
| 5,301,275 A | 4/1994 | Vanbuskirk et al. |
| 5,303,237 A | 4/1994 | Bergman et al. |
| 5,544,342 A | 8/1996 | Dean |
| 5,913,045 A | 6/1999 | Gillespie et al. |
| 5,920,572 A | 7/1999 | Washington et al. |
| 5,941,964 A | 8/1999 | Young et al. |
| 6,076,015 A | 6/2000 | Hartley et al. |
| 6,651,163 B1 | 11/2003 | Kranich et al. |
| 6,807,628 B2 | 10/2004 | Homewood et al. |
| 2003/0084219 A1* | 5/2003 | Yao et al. ................. 710/300 |

* cited by examiner

*Primary Examiner*—Hetul Patel
(74) *Attorney, Agent, or Firm*—BainwoodHuang

(57) ABSTRACT

A system, method and tangible medium for unified exception handling with distributed exception identification includes a packet processing pipeline with at least two processing stages for processing data packets, each of the data packets being processed having an associated exception map in a memory of the apparatus. An exception detector at each processing stage detects whether any exception conditions apply to the data packet at the processing stage, and if so, a bit setter sets, modifies, or resets one or more bits in the exception map associated with exception conditions detected at the processing stage. An exception handler processes the exception map in response to the state of in the exception map after all the processing stages are complete.

19 Claims, 3 Drawing Sheets

METHOD AND APPARATUS FOR UNIFIED EXCEPTION HANDLING WITH DISTRIBUTED EXCEPTION IDENTIFICATION

CROSS-REFERENCE TO RELATED APPLICATION

This application claims priority based on U.S. patent application Ser. No. 09/758,540, entitled "Method And Apparatus For Unified Exception Handling With Distributed Exception Identification" in the name of inventors Harish Devanagondi, Rajesh Patil, Sanjeev Mahalawat, Jianyong Sun, filed on Jan. 10, 2001 and issued as U.S. Pat. No. 7,062,641.

FIELD OF THE INVENTION

This invention relates to computer systems. More particularly, this invention relates to the handling of exceptions. Even more particularly, this invention relates to a method and apparatus for unifying exception handling with a distributed exception identification.

BACKGROUND OF THE INVENTION

Many computer processors contain exception handlers. Exception handlers are well known in the art. They are utilized in processors to process non-routine instructions. Non-routine instructions invoke an exception condition either before, during, or after executing an instruction.

When an exception condition is noted during the execution of an instruction, normal processing is interrupted and the processor must save the context of the interrupted process by noting the process status of each instruction currently in process. Each exception has an associated vector to locate a corresponding exception handling routine. The exception handler then performs a sequence of actions either in the form of a software routine or in the form of hardware computation to determine the cause of the exception condition and processes the exception condition by performing any function to the exception requires. After the exception condition is handled, the processor returns to the normal process for each instruction that was being processed at the process point for each such instruction when the exception condition occurred. Moreover, each exception handler can itself invoke exception handlers.

A network switch or router is a system that processes network data packets. Similar to a computer processor, a network switch or router may encounter exception conditions during the course of processing a network data packet.

A common technique called pipelining is employed to increase the rate of processing in computer processors and network switches and routers. Pipelining causes the data packet to traverse multiple processing stages in a serial manner. Each processing stage completes a part of the entire processing necessary.

In a pipelined processor, exception conditions may be detected in every stage. Some exception conditions, although detected in different stages, require the same exception handling. If exception handlers were attached to processing stages, a particular exception handler needs to be replicated and each instance attached to a different stage. Also, an exception handler attached to a processing stage may be required to modify the processing already completed by previous processing stages or previous exception handlers. This leads to exception handlers that are complex and large in number.

Thus, there exists a need for a more efficient and improved method and apparatus for detecting and handling exceptions.

BRIEF DESCRIPTION OF THE INVENTION

An apparatus for unified exception handling with distributed exception identification includes a packet processing pipeline with at least two processing stages for processing data packets, each of the data packets being processed having an associated exception map in a memory of the apparatus. An exception detector at each processing stage detects whether any exception conditions apply to the data packet at the processing stage, and if so, a bit setter sets, modifies, or resets one or more bits in the exception map associated with exception conditions detected at the processing stage. An exception handler processes the exception map in response to the state of in the exception map after all the processing stages are complete. The method provides for processing a data packet through at least two pipelined processing stages in a data packet processor such as a switch, router, bridge, or similar network device, each of the data packets has associated with it (while it is being processed) an exception map disposed in a memory of the network device. The bits in the exception map are set, modified, or reset in response to exception conditions detected at the various processing stages. After the packet has been fully processed, an exception handler takes as an input the exception map and further processes the packet in response to the state of the exception map.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

DETAILED DESCRIPTION

Embodiments of the present invention are described herein in the context of a method and apparatus for unified exception handling with a distributed exception identification. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
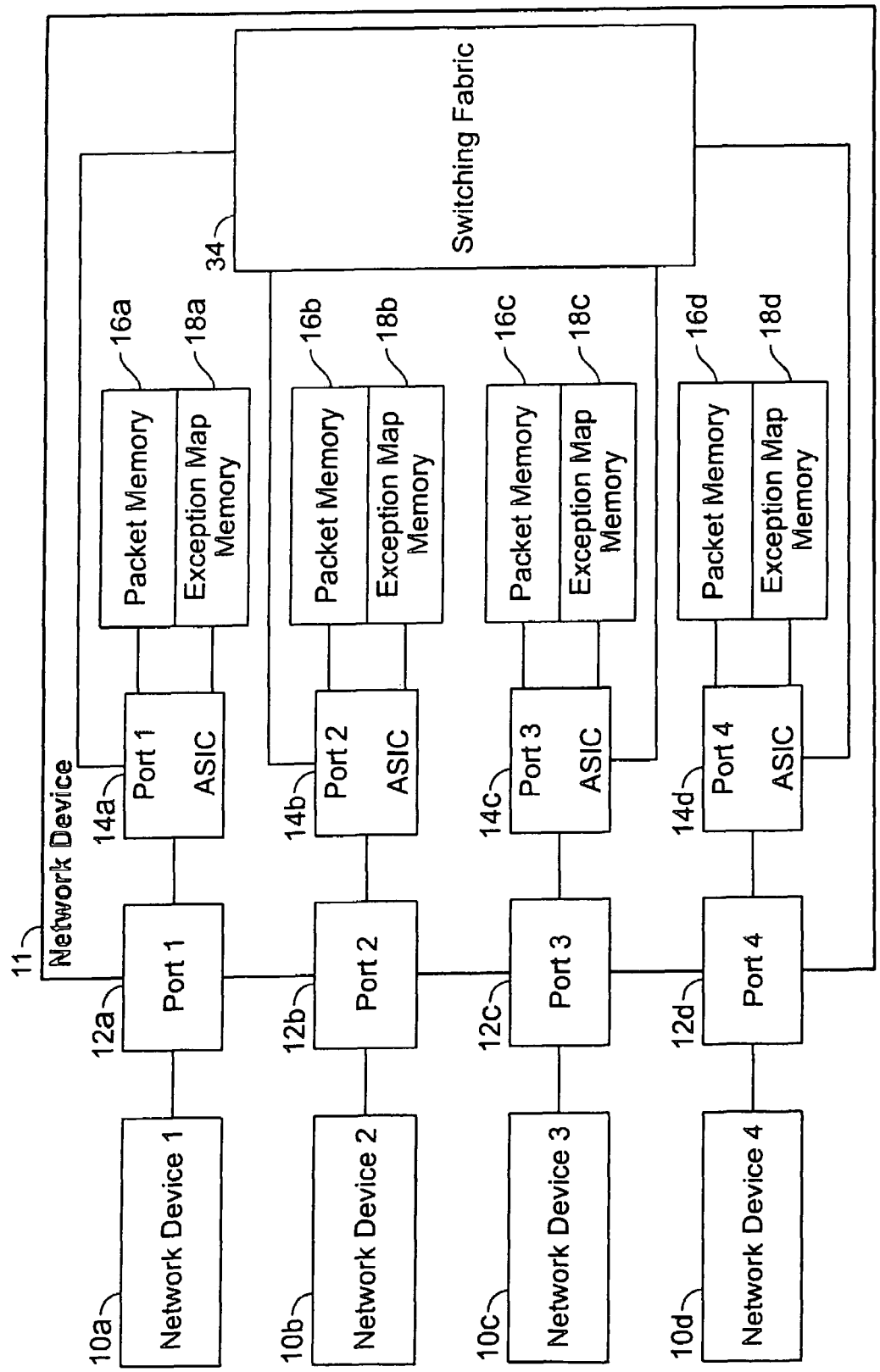
FIG. 1 is a system block diagram of a network device in accordance with one specific embodiment of the present invention.

One specific embodiment of this invention, as shown in FIG. 1, provides for an apparatus to unify exception handling with a distributed exception identification system. Data packets are received at a port 12a-d of a network device 11 from other Network Devices 1-4 (10a-10d). Network device 11 is a device such as a router or a switch, and includes data packet processors 14a-d, such as a port ASICS, or similar pipelined packet processors. Port ASICS 14a-d are shown here in accordance with one specific embodiment of this invention. The data packet processors 14a-d include a pipelined packet processor where the data packet will be processed through at least two processing stages. While each pipelined packet processor performs its functions, the data packet is temporarily stored in a packet memory 16a-d until completion of all the processing stages. The data packets are forwarded to other destinations, such as other port ASICS, through a central interconnecting network device such as a switching fabric 34 at the completion of all the processing stages. The switching fabric 34 interconnects all the network devices, such as all the port ASICS in the network device.

Figure 2A:
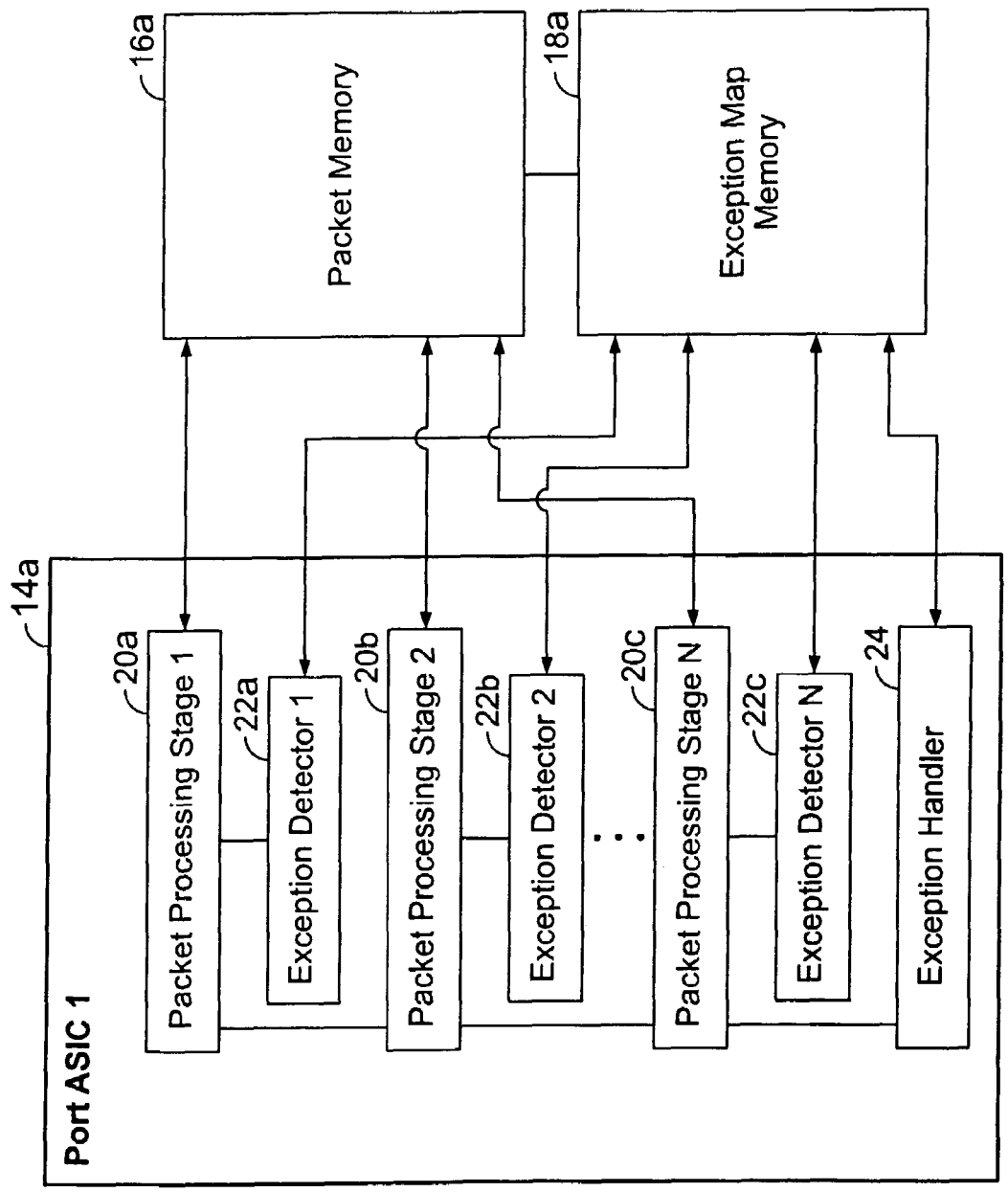
FIG. 2A is a system block diagram of a port ASICS processor and the associated packet memory and exception map memory of a network device in accordance with one specific embodiment of a data packet processor.

In accordance with the present invention, each data packet has an associated exception map, which is either appended to the data packet in a packet memory 16a-16d of the data packet processor or is stored in a separate exception map memory 18a-d associated with the data packet. The exception map has a number of bits that are each associated with a particular exception condition, as is further discussed below. In a specific embodiment as illustrated in FIGS. 1 and 2A, the exception map is stored in a separate exception map memory 18a-d associated with the data packet and has sixteen (16) bits, each potentially associated with a different exception condition. Some or all exception conditions and their handling may be programmable by an administrator of the network device. In another embodiment, the exception map is transferred from one processing stage to the next along with a pointer or reference to the data packet in the data packet memory. However, those of ordinary skill in the art will now realize that there are many other ways to associate the exception map with a data packet and the exception map may have any numbers of bits including bits reserved for future use.

Figure 2B:
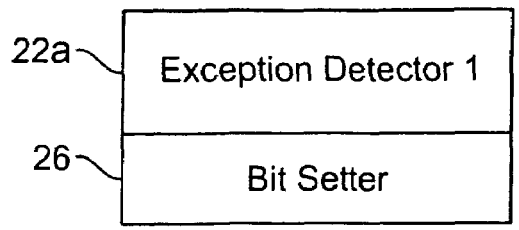
FIG. 2B is a system block diagram of an exception detector of a port ASICS processor in accordance with the diagram of FIG. 2A.

Now referring to FIGS. 2A and 2B, the packet processing pipeline may be configured and programmed to perform a number of functions. In a specific embodiment, the packet processing pipeline may comprise eight processing stages, however, those of ordinary skill in the art will now realize that the number of stages will vary according to the network device designer's desires in processing the data packets. As a data packet is processed through the N (an integer $\geq 2$) packet processing stages 20a-c, each processing stage 20a-c performs a different function. For example, one processing stage may require a look up of the destination address in a forwarding table, which comprises a list matching the Internet Protocol (IP) address with a destination address (DA), or the processing stage may provide for the modification of the forwarding table based on the data packet. Another processing stage may look at the header of the data packet and in response set a quality of service (QOS) tag for the data packet. Still another processing stage may determine the protocols carried by the packet to determine whether the packet should have access to the network. Thus, each processing stage may perform a different function.

Each pipelined packet processing stage 20a-c has an exception detector 22a-c to detect the presence of any of a number of exception conditions. Examples of exception conditions are IP header error, Cyclic Redundancy Check error, DA exception, QOS check, security protocol check, and the like. The exception conditions are recognized by the exception detector by performing logical operations such as an and/or operations, comparisons, arithmetic calculations, and the like. As the data packet is being processed at each processing stage 20a-c, the data packet may be stored in the packet memory 16a-d and the associated exception map is stored in the exception map memory 18a-d.

At each processing stage 20a-c, if the exception detector 22a-c detects an exception condition, a bit setter 26 sets, modifies, or resets the bit that is associated with the exception condition in a conventional manner in accordance with pre-programmed instructions. In each processing stage 20a-c, one or more bits may be set or reset depending on whether one or more exception conditions are detected. Thus, this invention provides that each processing stage 20a-c may set one or more bits and subsequent processing stages may over-rule or reset the bits set in previous stages. Throughout each processing stage 20a-c, the exception conditions detected by the exception detectors 22a-c are not handled at each processing stage 20a-c. Rather, the bits associated with the exception conditions are set or reset in the exception map which is stored in the exception map memory 18a-d. This allows for the identification of various exceptions in a uniform distributed manner and allows for a more efficient processing of the data packet. Normal processing is not interrupted at each processing stage and with data packet receiving rates increasing, this assembly line fashion of identifying exception conditions distributes the work of exception detection among various stages so that all the work does not have to be completed in one processing stage.

Once the data packet completes the final processing stage, the exception map is then taken as an input by the exception handler 24, from the exception map memory 18a-d, to be processed. The exception handler 24 may be implemented in hardware or software to interpret and process the exception map. The exception handler 24 has a set of instructions, which may be configured and programmed by an administrator of the network device, to determine a hierarchy in which to process the exception map in an efficient manner. The instructions may direct the exception handler 24 to process the exception map in a certain order, such as processing the bits from the last bit to first bit, first bit to last bit, or some other desired manner. Another manner to process the exception map is to instruct the exception handler to carry out exception conditions in the last bit only. The advantage of this is that if the last bit is associated with the exception condition to delete the data packet (due, for example, to the expiration of the time-to-live counter), the exception handler would not have to interpret and process any other bits if the data packet will eventually be deleted. This allows for a more efficient and speedy means to implement the exception handler. Those of ordinary skill in the art will now realize that there are many additional ways to program the exception handler to efficiently process the exception map and speed packet throughput.

The exception handler 24 may also contain a list of exception handling instructions, which are also configured and programmed by an administrator of the network device. As the exception handler 24 processes the exception map pursuant to the instructions and detects that a bit is set for a certain exception condition, the handler consults the exception handling instruction for the exception condition to determine how to process the exception condition. For example, if the bit associated with the exception condition to delete the packet is set, the interpreter will consult the exception handling instruction for deleting the packet to determine how to process the data packet. At the completion of all the processing stages, the exception map may effect any number of parts of the data packet such as its destination address(es), destination port(s), the QOS provided to the packet, the enablement or disablement of certain functions which are to be performed to the data packet, or even whether an additional processing stage is to be performed on the data packet.

Figure 3:
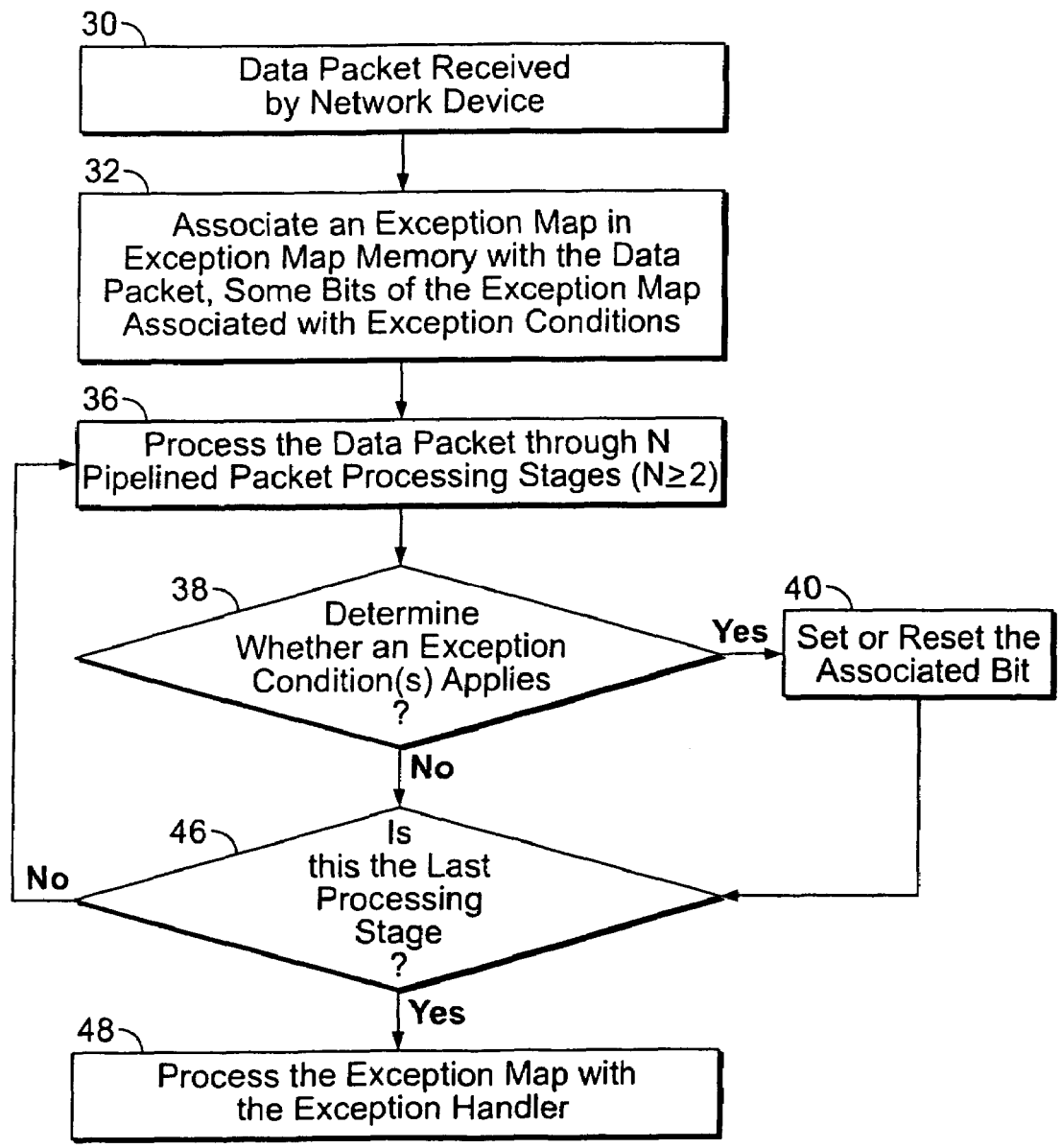
FIG. 3 is a process flow diagram illustrating a method of processing packets in accordance with a specific embodiment of the present invention.

This invention also provides for a method for unified exception handling, as shown in FIG. 3. Data packets are received at a port of a network device 30, such as a switch, router, or bridge and are processed in a data packet processor, such as a port ASICS or a similar network device. As the data packets are received, each data packet is associated with an exception map in the exception map memory (step 30). The exception map may either be appended to the data packet in a packet memory of the network device or is stored in a separate exception map memory associated with the data packet (step 32). In still another embodiment, the exception map is transferred from one processing stage to the next along with a pointer or reference to the data packet in the data packet memory. The exception map has a number of bits that are associated with a particular exception condition. In a specific embodiment, the exception map is stored in the exception map memory associated with the data packet and has sixteen (16) bits, each potentially associated with a different exception condition. However, those of ordinary skill in the art will now realize that there are many other ways to associate the exception map with a data packet and the exception map may have any numbers of bits including bits reserved for future use.

The data packet processor processes the data packets through a plurality of pipelined packet processing stages (step 36) which are configured and programmed according to an administrator's desires and thus, the number of processing stages may vary. In a preferred embodiment, the packet processing pipeline may comprise eight processing stages, however, those of ordinary skill in the art will realize that the number of stages will vary according to the administrator's desires in processing the data packets. As the N (an integer ≧2) processing pipeline stages (Step 36) are completed, the data packet may be temporarily stored in a data packet memory. Each processing stage performs a different function, for example, one processing stage may require a look up of the destination address in a forwarding table, which comprises a list matching the IP address with a DA, or the processing stage may provide for the modification of the forwarding table based on the data packet. Another processing stage may look at the header of the data packet and in response set a QOS tag for the data packet. Still another processing stage may determine the protocols carried by the packet to determine whether the packet should have access to the network. Thus, each processing stage may perform a different function.

At each pipelined packet processing stage, it is determined by an exception detector whether any of a number of exception conditions apply to the data packet (step 38). The exception condition is recognized by the exception detector by performing logical operations such as and/or operations, comparisons, arithmetic calculations, and the like. If an exception condition is detected, a bit setter sets, modifies, or resets the bits associated with the exception conditions (step 40) in a conventional manner in accordance with pre-preprogrammed instructions. At each processing stage, there may be one or more exception conditions detected. Thus, more than one bit may be set in one processing stage and subsequent processing stages may over-rule or rest the bits set in previous stages. Thus, this invention provides for a more efficient method of exception handling by unifying the exception handling in an exception map, allowing more than one bit to be set in each processing stage, and allowing more than one bit to be changed or over-ruled by succeeding processing stages.

If an exception condition is not detected, and there are more processing stages to be completed (step 46), the packet will continue to proceed through the remaining N pipeline packet processing stages. Otherwise, if the last processing stage was completed (step 46), the exception map is processed with the exception handler (step 48). The exception handler may be implemented in hardware or software to interpret and process the exception map. The exception handler has a set of instructions, which may be configured and programmed by an administrator of the network device. The exception handler uses the instructions to determine a hierarchy in which to process the exception map in an efficient manner. The instructions may direct the exception handler to carry out the exception conditions in a certain order, such as processing the bits from the last bit to first bit, first bit to last bit, or some other desired manner. Another manner to process the exception map is to instruct the exception handler to carry out exception conditions in the last bit only. The advantage of this is that if the last bit is associated with the exception condition to delete the data packet (due, for example, to the expiration of the time-to-live counter), the exception handler would not have to interpret and process any other bits if the data packet will eventually be deleted. This allows for a more efficient and speedy means to implement the exception handler. Those of ordinary skill in the art will now realize that there are many additional ways to program the exception handler to efficiently process the exception map and speed packet throughput.

The exception handler may also contain a list of exception handling instructions in the memory, which are also configured and programmed by an administrator of the network device. As the exception handler processes the exception map pursuant to the instructions and detects that a bit is set for a certain exception condition, the handler consults the exception handling instruction for the exception condition to determine how to process the exception condition. For example, if the bit associated with the exception condition to delete the packet is set, the interpreter will consult the exception handling instruction for deleting the packet to determine how to process the data packet. At the completion of all the processing stages, the exception map may effect any number of parts of the data packet such as its destination address(es), destination port(s), the QOS provided to the packet, the enablement or disablement of certain functions which are to be performed to the data packet, or even whether an additional processing stage is to be performed on the data packet.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A network device comprising:
    a packet processor configured to process incoming data packets each having an corresponding exception map associated with an exception condition, wherein the exception map has one or more entries associated with a particular exception condition, the exception map being stored in a memory;
    an exception detector configured to detect whether an exception condition applies to a data packet, wherein one or more entries of the exception map is updated while the exception map remains in the memory if the particular exception condition applies to the data packet; and
    an exception handler to process the exception map from the memory after all of the one or more entries is updated;
    wherein the exception handler is configured to process the exception map in response to the entry undated in the exception map after the data packet is processed.

2. The network device of claim 1, wherein the exception condition includes at least one logical operation.

3. The network device of claim 1, further comprising a first memory configured to store the data packet and a second memory configured to store the exception map.

4. The network device of claim 1, wherein the packet processor further comprises a plurality of processing stages each configured to process a designated portion of the data packet.

5. The network device of claim 1, wherein the packet processor further comprises a plurality of packet processors each configured to receive incoming data packets from separate external network devices.

6. The network device of claim 1, further comprising a bit setter coupled to the exception detector, the bit setter configured to set, modify or reset the one or more entries in updating the one or more entries.

7. The network device of claim 1, further comprising an updater responsive to the exception detector and configured for updating the one or more entries if the particular exception condition applies to the data packet.

8. A method for operating a network device comprising:
    processing an incoming data packet having a corresponding exception map in one or more processing stages, wherein the exception map has one or more entries associated with an exception condition, the exception map being stored in a memory;
    updating at least one entry in the exception map upon determining whether a particular exception condition applies to the data packet while the exception map is stored in the memory; and
    processing the exception map from the memory after the entry is updated and all of the one or more processing stages are complete.

9. The method of claim 8 wherein the updating further comprises setting, modifying or resetting the at least one entry.

10. The method of claim 8 further comprising applying logical operations to the exception condition.

11. The method of claim 8 further comprising storing the exception map in a memory associated with the data packet.

12. The method of claim 8, wherein the data packet is processed in a plurality of processing stages, wherein designated portions of the data packet are processed in assigned processing stages.

13. The method of claim 8, wherein the processing further comprises receiving a plurality of data packets from a plurality of external network devices, wherein the data packets received from the external network devices are separately processed per network device.

14. A program storage device readable by a machine, tangibly embodying a program of instructions executable by the machine to perform a method for operating a network device, the method comprising:
    processing an incoming data packet having a corresponding exception map in one or more processing stages, wherein the exception map has one or more entries associated with an exception condition, the exception map being stored in a memory
    updating at least one entry in the exception map upon determining whether a particular exception condition applies to the data packet while the exception map is stored in the memory and
    processing the exception map from the memory after the entry is updated and all of the one or more processing stages are complete.

15. The method of claim 14 wherein the updating further comprises setting, modifying or resetting the at least one entry.

16. The method of claim 14 further comprising applying logical operations to the exception condition.

17. The method of claim 14 further comprising storing the exception map in a memory associated with the data packet.

18. The method of claim 14, wherein the data packet is processed in a plurality of processing stages, wherein designated portions of the data packet is processed in assigned processing stages.

19. The method of claim 14, wherein the processing further comprises receiving a plurality of data packets from a plurality of external network devices, wherein the data packets received from the external network devices are separately processed per network device.

* * * * *

UNITED STATES PATENT AND TRADEMARK OFFICE
CERTIFICATE OF CORRECTION

PATENT NO. : 7,529,908 B2 Page 1 of 1
APPLICATION NO. : 11/431444
DATED : May 5, 2009
INVENTOR(S) : Devanagondi et al.

It is certified that error appears in the above-identified patent and that said Letters Patent is hereby corrected as shown below:

On the cover page, item [73] Assignee "Cisco Technology, INc., San Jose, CA (US)" should read --Cisco Technology, Inc., San Jose, CA (US)--

Claim 1, Column 7, Lines 27-29, "wherein the exception handler is configured to process the exception map in response to the entry undated in the exception map after the data packet is processed." should read --wherein the exception handler is configured to process the exception map in response to the entry updated in the exception map after the data packet is processed--.

Signed and Sealed this

Sixteenth Day of June, 2009

JOHN DOLL
*Acting Director of the United States Patent and Trademark Office*